(12) United States Patent
Wang et al.

(10) Patent No.: US 9,748,390 B2
(45) Date of Patent: Aug. 29, 2017

(54) SEMICONDUCTOR DEVICE AND METHOD OF FORMING THE SAME

(71) Applicant: Taiwan Semiconductor Manufacturing Company, Ltd., Hsin-Chu (TW)

(72) Inventors: Tsan-Chun Wang, Hsin-Chu (TW); Ziwei Fang, Baoshan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/206,710

(22) Filed: Jul. 11, 2016

(65) Prior Publication Data

US 2016/0322496 A1 Nov. 3, 2016

Related U.S. Application Data

(63) Continuation of application No. 14/547,068, filed on Nov. 18, 2014, now Pat. No. 9,401,414, which is a
(Continued)

(51) Int. Cl.
*H01L 29/78* (2006.01)
*H01L 27/092* (2006.01)
(Continued)

(52) U.S. Cl.
CPC .... *H01L 29/7848* (2013.01); *H01L 21/26506* (2013.01); *H01L 21/26513* (2013.01); *H01L 21/324* (2013.01); *H01L 21/823807* (2013.01); *H01L 21/823814* (2013.01); *H01L 27/092* (2013.01); *H01L 29/0847* (2013.01); *H01L 29/165* (2013.01); *H01L 29/30* (2013.01); *H01L 29/6659* (2013.01); *H01L 29/66477* (2013.01); *H01L 29/66492* (2013.01); *H01L 29/66545* (2013.01); *H01L 29/78* (2013.01); *H01L 29/7833* (2013.01); *H01L 29/7847* (2013.01);
(Continued)

(58) Field of Classification Search
CPC ..... H01L 21/823807; H01L 21/823814; H01L 29/7848; H01L 21/26506; H01L 29/78; H01L 21/02381; H01L 29/1054
See application file for complete search history.

(56) References Cited

U.S. PATENT DOCUMENTS

2010/0038685 A1\* 2/2010 Weber ............... H01L 21/26506
257/288
2010/0148270 A1\* 6/2010 Golonzka ....... H01L 21/823807
257/369
(Continued)

FOREIGN PATENT DOCUMENTS

CN 102054695 A 5/2011

*Primary Examiner* — Roy Potter
*Assistant Examiner* — Paul Patton
(74) *Attorney, Agent, or Firm* — Slater Matsil, LLP

(57) ABSTRACT

A method of forming a semiconductor device includes forming a NMOS gate structure over a substrate. The method further includes forming an amorphized region in the substrate adjacent to the NMOS gate structure. The method also includes forming a lightly doped source/drain (LDD) region in the amorphized region. The method further includes depositing a stress film over the NMOS gate structure, performing an annealing process, and removing the stress film.

20 Claims, 9 Drawing Sheets

Related U.S. Application Data continuation of application No. 13/693,954, filed on Dec. 4, 2012, now Pat. No. 8,890,258.

(51) Int. Cl.

| | | |
|---|---|---|
| *H01L 21/8238* | (2006.01) | |
| *H01L 21/265* | (2006.01) | |
| *H01L 29/165* | (2006.01) | |
| *H01L 21/324* | (2006.01) | |
| *H01L 29/08* | (2006.01) | |
| *H01L 29/30* | (2006.01) | |
| *H01L 29/66* | (2006.01) | |

(52) U.S. Cl.
CPC .. *H01L 21/26586* (2013.01); *H01L 21/26593* (2013.01); *H01L 29/6656* (2013.01); *H01L 29/66636* (2013.01)

(56) References Cited

U.S. PATENT DOCUMENTS

2012/0061736 A1    3/2012  Yin et al.
2013/0187221 A1*  7/2013  Lu .................... H01L 21/26506
                                                                    257/329

\* cited by examiner

SEMICONDUCTOR DEVICE AND METHOD OF FORMING THE SAME

PRIORITY CLAIM

This application is a continuation of U.S. patent application Ser. No. 14/547,068, filed on 18 Nov. 2014, entitled "Semiconductor Device and Method of Forming the Same," which is a continuation of U.S. patent application Ser. No. 13/693,954, filed 4 Dec. 2012, entitled "Semiconductor Device and Method of Forming the Same," now U.S. Pat. No. 8,890,258, which applications are incorporated herein by reference.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as semiconductor devices, such as a metal-oxide-semiconductor field-effect transistors (MOSFETs), are scaled down through various technology nodes, strained source/drain features (e.g., stressor regions) have been implemented to enhance carrier mobility and improve device performance. Although existing approaches to forming stressor regions for IC devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
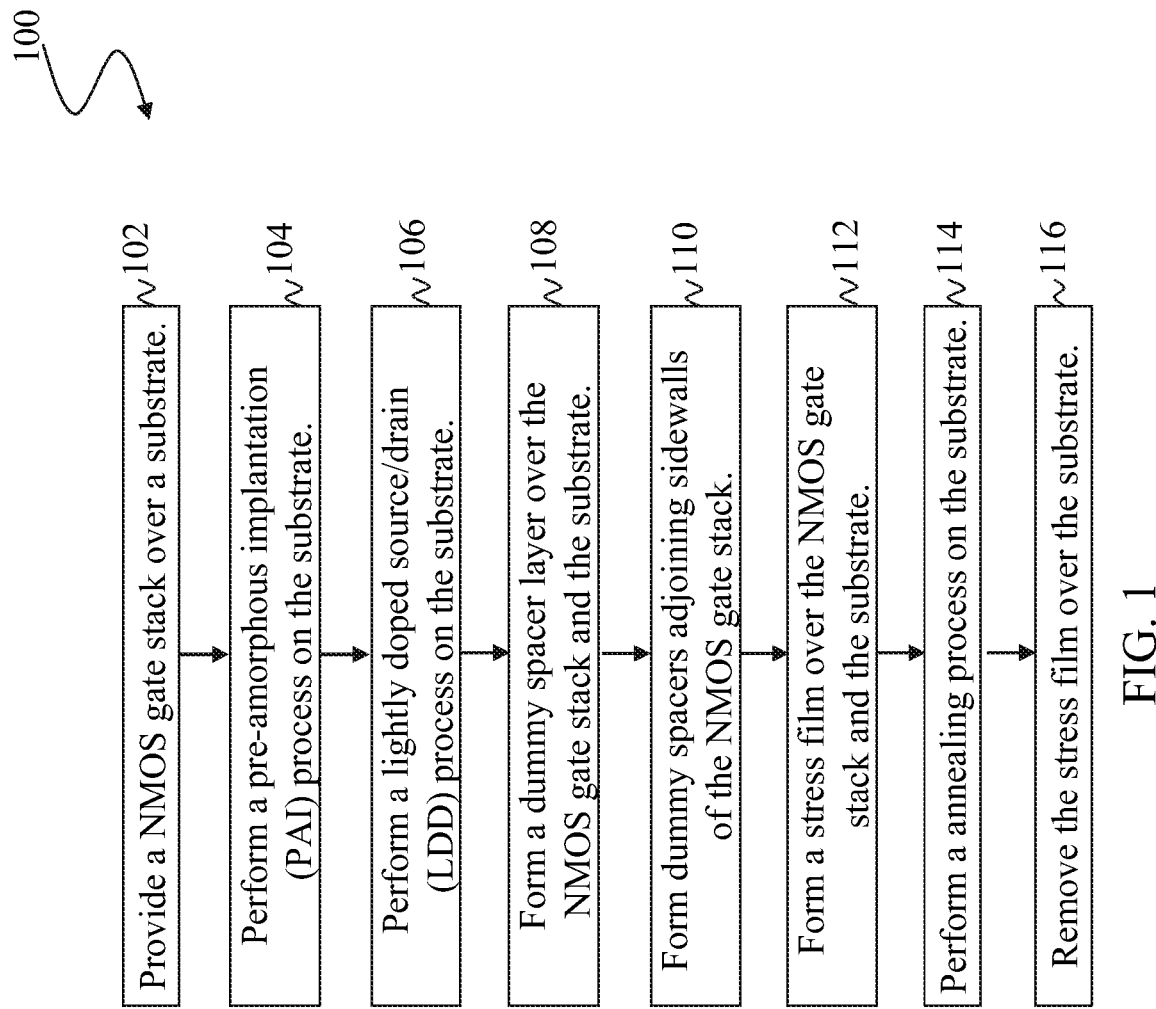
FIG. 1 is a flowchart illustrating a method of forming a semiconductor device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It is understood that those skilled in the art will be able to devise various equivalents that, although not explicitly described herein, embody the principles of the present invention.

Examples of devices that can benefit from one or more embodiments of the present invention are semiconductor devices with field effect transistors (FET). Such a device, for example, is a complementary metal-oxide-semiconductor (CMOS) field effect transistor. The following disclosure will continue with this example to illustrate various embodiments of the present application. It is understood, however, that the present application should not be limited to a particular type of device, except as specifically claimed.

With reference to FIGS. 1 and 2-9, a method 100 and a semiconductor device 200 are collectively described below. The semiconductor device 200 refers to an integrated circuit, or a portion thereof, that can comprise active devices such as metal-oxide-semiconductor field effect transistors (MOSFETs), complementary metal-oxide-semiconductor (CMOS) transistors, high voltage transistors, and/or high frequency transistors; other suitable components; and/or combinations thereof. The semiconductor device 200 may additionally include passive components, such as resistors, capacitors, inductors, and/or fuses. It is understood that the semiconductor device 200 may be formed by CMOS technology processing, and thus some processes are not described in detail herein. Additional steps can be provided before, during, or after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

Referring to FIG. 1, a method 100 for fabricating a semiconductor device is described according to various aspects of the present disclosure. The method 100 begins with step 102 in which a NMOS gate stack is formed over a substrate. The method 100 continues with step 104 in which a pre-amorphous implantation (PAI) process is performed on the substrate. The method 100 continues at step 106 in which a lightly doped source/drain (LDD) process is performed on the substrate. The method 100 continues at step 108 in which a dummy spacer layer is formed over the NMOS gate stack and the substrate. The method 100 continues at step 110 in which dummy spacers are formed adjoining sidewalls of the NMOS gate stack. The method 100 continues at step 112 in which a stress film is formed over the NMOS gate stack and the substrate. The method 100 continues at step 114 in which an annealing process is performed on the substrate. The method 100 continues at step 116 in which the stress film is removed from the substrate. The discussion that follows illustrates various embodiments of a semiconductor device 200 that can be fabricated according to the method 100 of FIG. 1.

Figure 2:
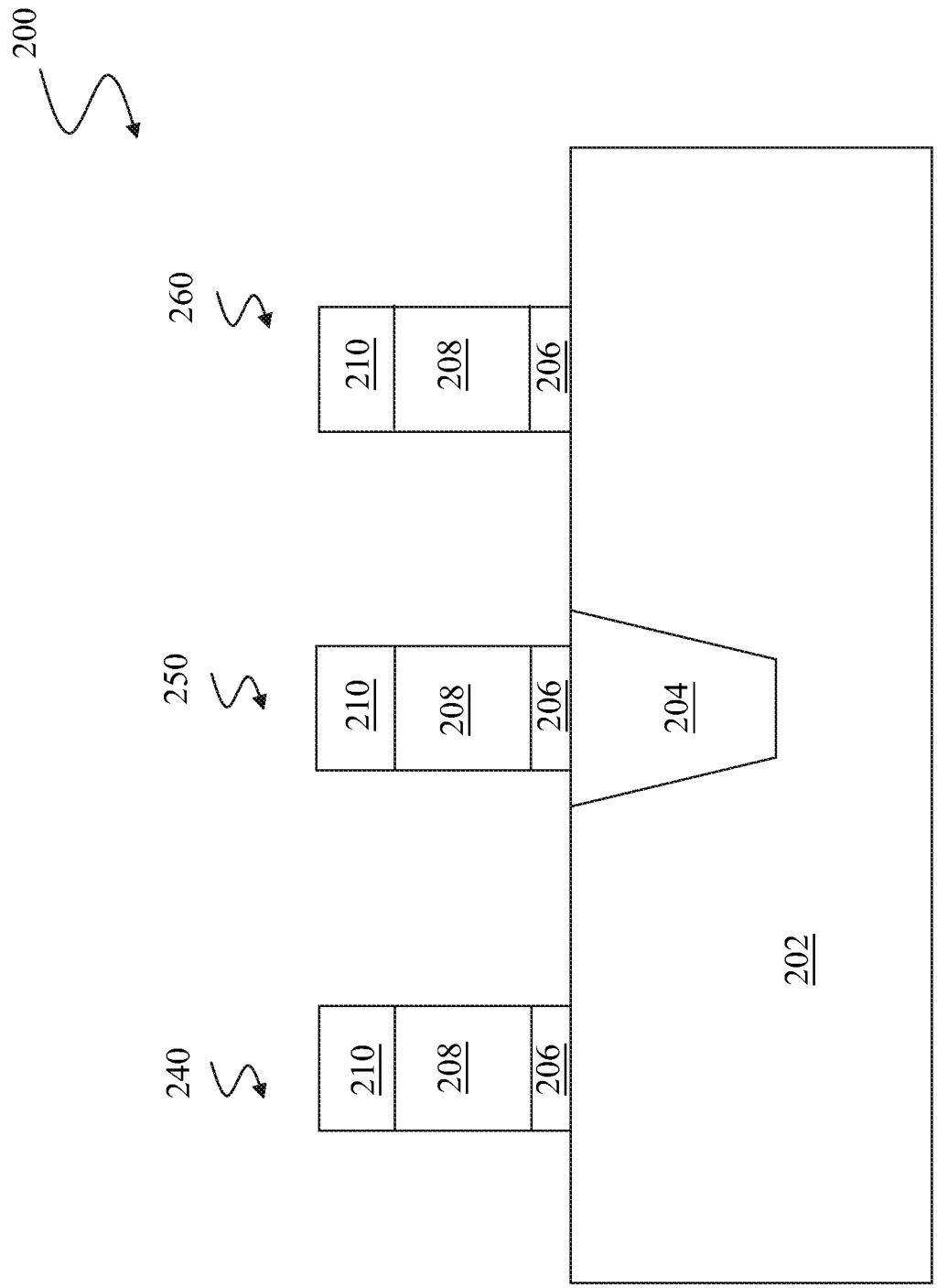
FIGS. 2 to 9 are cross-sectional side views of a semiconductor device at various stages of fabrication according to the method of FIG. 1 in accordance with one or more embodiments.

FIGS. 2 to 9 are cross-sectional side views of the semiconductor device 200 at various stages of fabrication according to the method 100 of FIG. 1. Referring to FIGS. 1 and 2, the method 100 begins at step 102, wherein a NMOS gate stack 240 is formed over a substrate 202. In some embodiments, a PMOS gate stack 260 is formed over the substrate 202. In some embodiments, a dummy gate stack 250 is formed over an isolation feature 204 in the substrate 202, and located between the NMOS gate stack 240 and the PMOS gate stack 260. Each of the NMOS gate stack 240 and the PMOS gate stack 260 defines a channel region of the substrate 202 thereunder. In the present embodiment, the NMOS gate stack 240 is preserved for forming a NMOS transistor device, the PMOS gate stack 260 is preserved for forming a PMOS transistor device, and the dummy gate stack 250 is preserved for gate connection and prevention of poly pattern loading effect.

In the present embodiment, the substrate 202 is a semiconductor substrate including silicon. In alternative embodiments, the substrate 202 includes an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Where the substrate 202 is an alloy semiconductor, the alloy semiconductor substrate could have a gradient SiGe feature in which the Si and Ge composition change from one ratio at one location to another ratio at another location of the gradient SiGe feature. The alloy SiGe could be formed over a silicon substrate, and/or the SiGe substrate may be strained. In yet another alternative embodiment, the semiconductor substrate could be a semiconductor on insulator (SOI).

The substrate 202 includes various doped regions depending on design requirements as known in the art (e.g., p-type wells or n-type wells). The doped regions are doped with p-type dopants, such as boron or $BF_2$, and/or n-type dopants, such as phosphorus or arsenic. The doped regions may be formed directly on the substrate 202, in a P-well structure, in an N-well structure, in a dual-well structure, or using a raised structure. In some embodiments, the isolation features 204 included in the substrate 202 is used to define and isolate various active regions of the substrate 202. The isolation features 204 utilize isolation technology, such as shallow trench isolation (STI) or local oxidation of silicon (LOCOS), to define and electrically isolate the various regions. The isolation features 204 include silicon oxide, silicon nitride, silicon oxynitride, other suitable materials, or combinations thereof.

Still referring to FIG. 2, in some embodiments, the NMOS gate stack 240, the dummy gate stack 250, and the PMOS gate stack 260 are formed by sequentially depositing and patterning a gate dielectric layer 206, a gate electrode layer 208, and a hard mask layer 210 on the substrate 202. The gate dielectric layer 206, in one example, is a thin film comprising silicon oxide, silicon nitride, silicon oxynitride, high-k dielectrics, other suitable dielectric materials, or combinations thereof. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. In the present embodiment, the gate dielectric layer 206 is a high-k dielectric layer with a thickness in the range of about 10 angstroms to about 30 angstroms. The gate dielectric layer 206 may be formed using a suitable process such as atomic layer deposition (ALD), chemical vapor deposition (CVD), physical vapor deposition (PVD), thermal oxidation, UV-ozone oxidation, or combinations thereof. The gate dielectric layer 206 may further comprise an interfacial layer (not shown) to reduce damage between the gate dielectric layer 206 and the substrate 202. The interfacial layer may comprise silicon oxide.

The gate electrode layer 208 is then formed on the gate dielectric layer 206. In some embodiments, the gate electrode layer 208 includes a single layer or multilayer structure. In the present embodiment, the gate electrode layer 208 comprises polysilicon. Further, the gate electrode layer 208 may be doped polysilicon with the same or different doping species. In one embodiment, the gate electrode layer 208 has a thickness in the range of about 30 nm to about 60 nm. The gate electrode layer 208 may be formed using a process such as low-pressure chemical vapor deposition (LPCVD), plasma enhanced chemical vapor deposition (PECVD), other suitable processes, or combinations thereof. Next, the hard mask layer 210 is formed over the gate electrode layer 208 and a patterned photo-sensitive layer (not shown) is formed on the hard mask layer 210. The pattern of the photo-sensitive layer is transferred to the hard mask layer 210 and then transferred to the gate electrode layer 208 and the gate dielectric layer 206 to form the NMOS gate stack 240, the dummy gate stack 250, and the PMOS gate stack 260. In some embodiments, the hard mask layer 210 includes silicon oxide. In alternative embodiments, the hard mask layer 210 includes silicon nitride, silicon oxynitride, and/or other suitable dielectric materials, and may be formed using a method such as CVD or PVD. The hard mask layer 210 has a thickness in the range from about 100 angstroms to about 800 angstroms. The photo-sensitive layer is removed thereafter by a dry and/or wet stripping process.

In some embodiments, source/drain (S/D) features (not shown) are formed in the substrate 202 adjacent to edges of the PMOS gate stack 260. In some embodiments, the source/drain features have a top surface higher than the top surface of the substrate 202. In some embodiments, the source/drain features have a top surface higher than the top surface of the substrate 202 with a height difference ranging between about 1 nm and about 10 nm. In alternative embodiments, the source/drain features have a top surface substantially coplanar with the top surface of the substrate 202. In some embodiments, the source/drain features are formed by forming recess cavities (not shown) in the substrate 202, then growing a strained material in the recess cavities. In some embodiments, the strained material is grown using a process including selective epitaxy growth (SEG), cyclic deposition and etching (CDE), chemical vapor deposition (CVD) techniques (e.g., vapor-phase epitaxy (VPE) and/or ultra-high vacuum CVD (UHV-CVD)), molecular beam epitaxy (MBE), other suitable epi processes, or combinations thereof. In some embodiments, the strained material has a lattice constant different from the substrate 202 to induce a strain or stress on the channel region of the semiconductor device 200, and therefore enable carrier mobility of the device to enhance the device performance.

Figure 3:
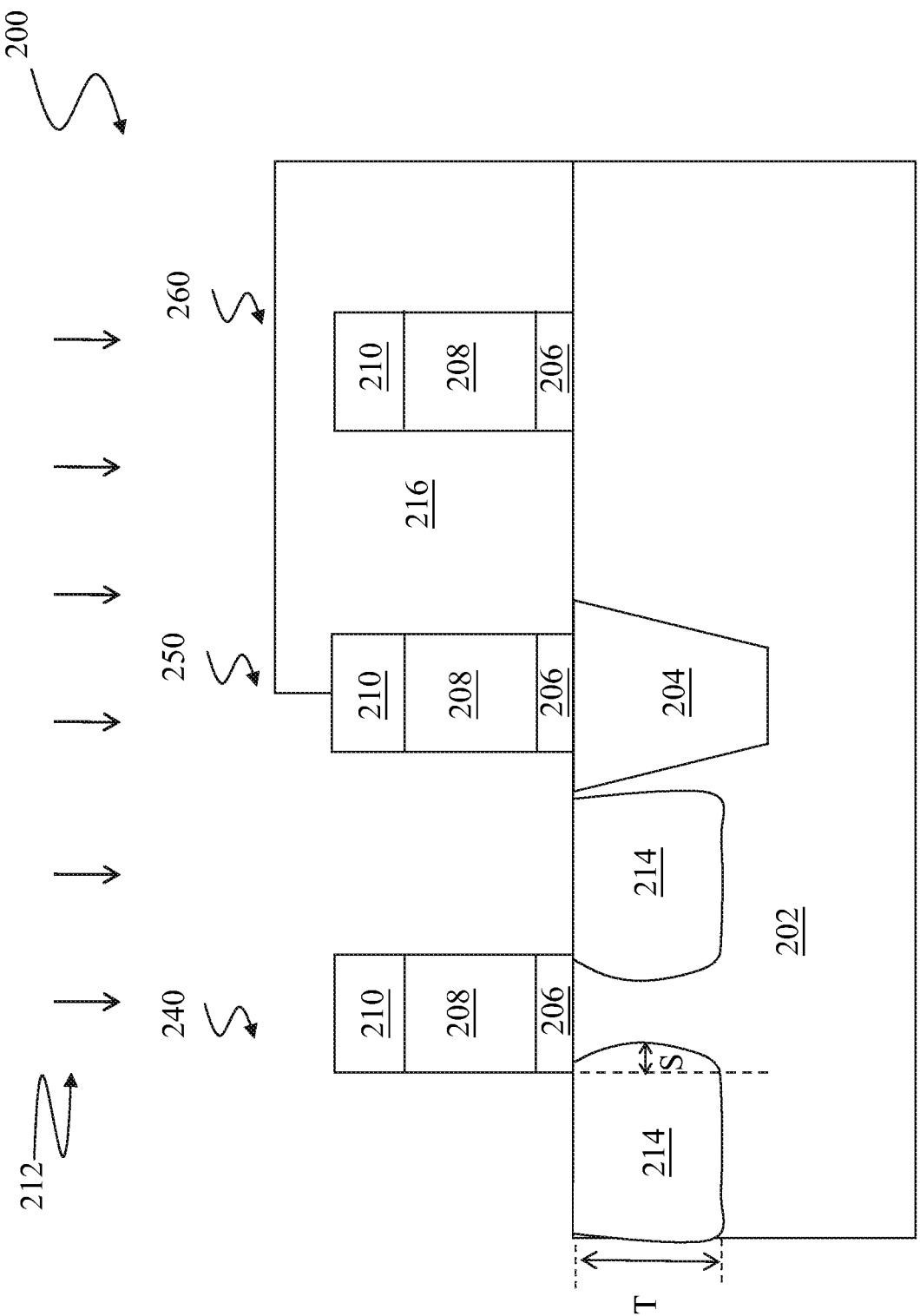

Referring to FIGS. 1 and 3, the method 100 proceeds to step 104, wherein a pre-amorphous implantation (PAI) process 212 is performed on the substrate 202. In some embodiments, the PAI process 212 implants the substrate 202 and causes damage to the lattice structure of the substrate 202 to form amorphized regions 214. In the present embodiment, the amorphized regions 214 are formed in source/drain (S/D) regions adjacent to the opposite edges of the NMOS gate stack 240 using the NMOS gate stack 240 as a mask. In the present embodiment, the amorphized regions 214 are formed in the substrate 202 adjacent the opposite edges of the NMOS gate stack 240 using the NMOS gate stack 240 without sidewalls spacers as a mask. The amorphized regions 214 have a thickness T (measured from an upper surface of the substrate 202) and a lateral space S (measured from a sidewall of the NMOS gate stack 240 to an adjacent boundary of the amorphized regions 214). The thickness T and the lateral space S are formed according to design specifications. The thickness T and the lateral space S can be controlled by the PAI process 212, such as implant energy, implant species, and/or implant dosage.

In some embodiments, the PAI process 212 utilizes implant species, such as Ge, Ar, Xe, C, $BF_2$, As, In, other suitable implant species, or combinations thereof. In the present embodiment, the PAI process 212 implants the substrate 202 with species classified in the fourth column of the periodic table of the elements. In the present embodiment, the PAI process 212 implants the substrate 202 with species with an atomic mass ranges from about 12 to about 72. In the present embodiment, owing to the absence of spacers adjoining sidewalls the NMOS gate stack 240, the atomic mass of the implanted species and/or the implant energy is controlled within a limited value for ensuring the thickness T and/or the lateral space S is less than a predetermined value. The thickness T, in some embodiments, ranges less than about 150 nanometers. The lateral space S, in some embodiments, ranges less than about 3 nanometers. In the present embodiment, the atomic mass of the implanted species is less than about 28, e.g., silicon (Si). In some embodiments, the PAI process 212 implants the species at an implant energy less than about 20 KeV. In the present embodiment, the PAI process 212 implants the species at an implant energy ranging between about 10 KeV and about 20 KeV. In the present embodiment, the PAI process 212 implants Si, at an implant energy less than about 20 KeV, and an implant dosage ranging from about $1 \times 10^{14}$ atoms/$cm^2$ to about $2 \times 10^{15}$ atoms/$cm^2$, depending on the implantation temperature. In at least one embodiment, the PAI process 212 is performed at room temperature (e.g. 25° C.). In an alternative embodiment, the PAI process 212 is performed at a low temperature (e.g., −60° C. to −100° C.) by adapting a Cryo (low temperature) function in the ion implanter to enhance the efficiency of implant amorphization. In some embodiments, the PAI process 212 is performed with a tilt angle ranging from about 0 degree to about 20 degrees.

In some alternative embodiments, the PAI process 212 can be a multiple-step implantation process, including at least a first step and a second step of the implantation process. The first and the second steps of the implantation process are performed using a first and a second implant energy levels, a first and a second implant dosages, and a first and a second implant tilt angles, respectively. In at least one embodiment, the first and the second implant energy levels less than about 20 KeV. In another embodiment, the first implant energy level is greater than the second implant energy level. In at least one embodiment, the first and the second implant dosages range from about $1 \times 10^{14}$ atoms/$cm^2$ to about $2 \times 10^{15}$ atoms/$cm^2$. In another embodiment, the first implant dosage is greater than the second implant dosage. In some embodiments, a combined dosage of the first and the second implant dosages range from about $1 \times 10^{14}$ atoms/$cm^2$ to about $2 \times 10^{15}$ atoms/$cm^2$, and a ratio between the first and the second implant dosages ranges from about 1:1 to about 7:3. In one embodiment, the first and the second tilt angles range from about 0 degree to about 20 degrees. In another embodiment, the first implant tilt angle is greater than the second implant tilt angle.

Figure 4:
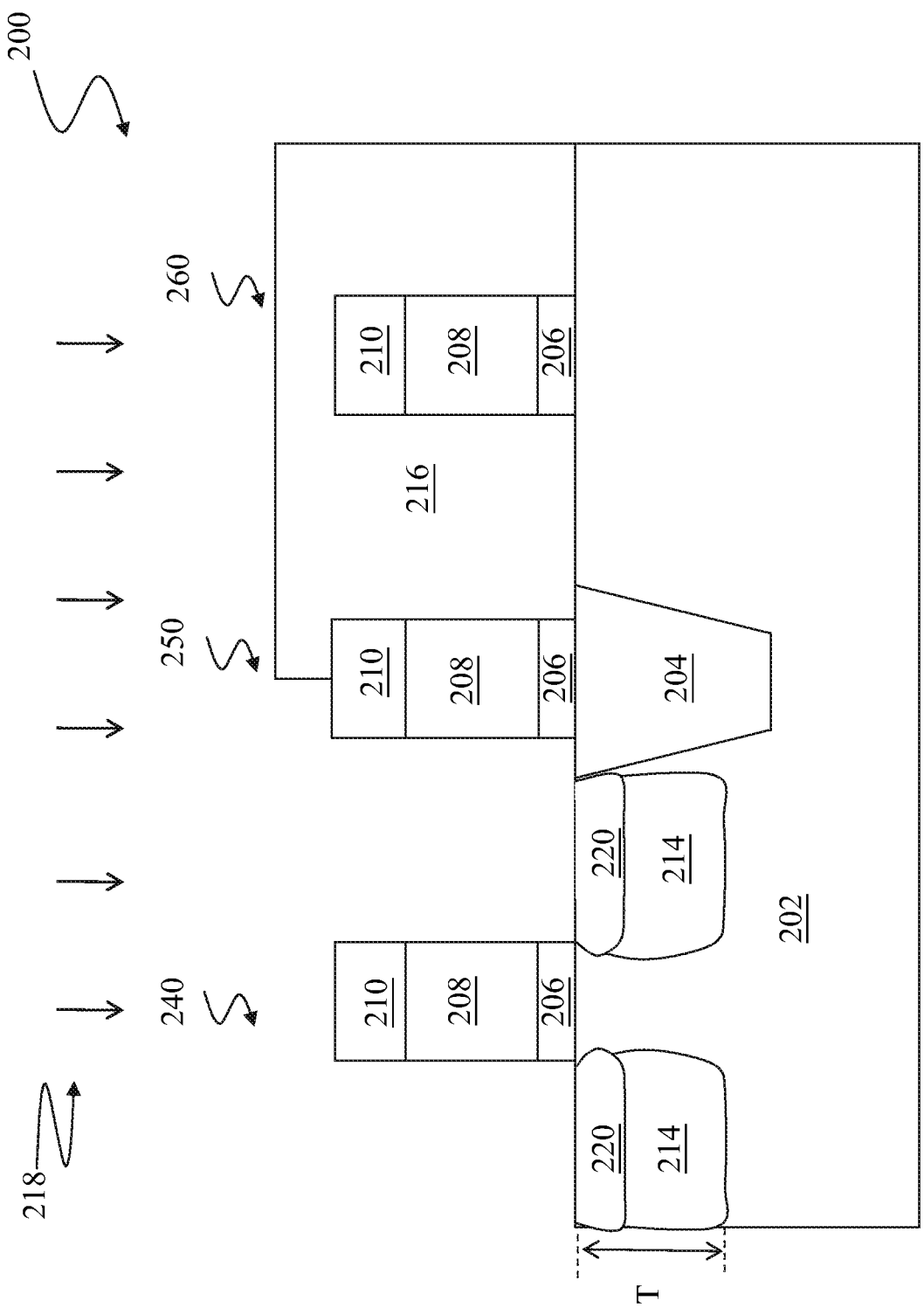

Referring to FIGS. 1 and 4, the method 100 proceeds to step 106 wherein an implantation process 218 is performed on the substrate 202. In some embodiments, the implantation process 218 implants a n-type impurity in the substrate 202 to form lightly doped source/drain (LDD) regions 220 adjacent to opposite edges of the NMOS gate stack 240. The NMOS gate stack 240 acts as a mask so that the LDD regions 220 are substantially aligned with the edges of the respective NMOS gate stack 240. In some embodiments, the LDD regions 220 are formed within the upper portions of amorphized regions 214. Halo/pocket regions (not shown) are also formed in the substrate 202, preferably by implanting a p-type impurity adjacent to the NMOS gate stack 240. In the present embodiment, the dummy gate stack 250 and the PMOS gate stack 260 are covered by a protector 216 during the PAI process 212 and the implantation process 218 such that no amorphized regions or LDD regions formed adjacent to edges of the dummy gate stack 250 or the PMOS gate stack 260. In some embodiments, the protector 216 is a patterned photoresist layer or hard mask layer. The protector 216 is then removed after the LDD implantation process 218 by, for example, an etching process or stripping process.

Figure 5:
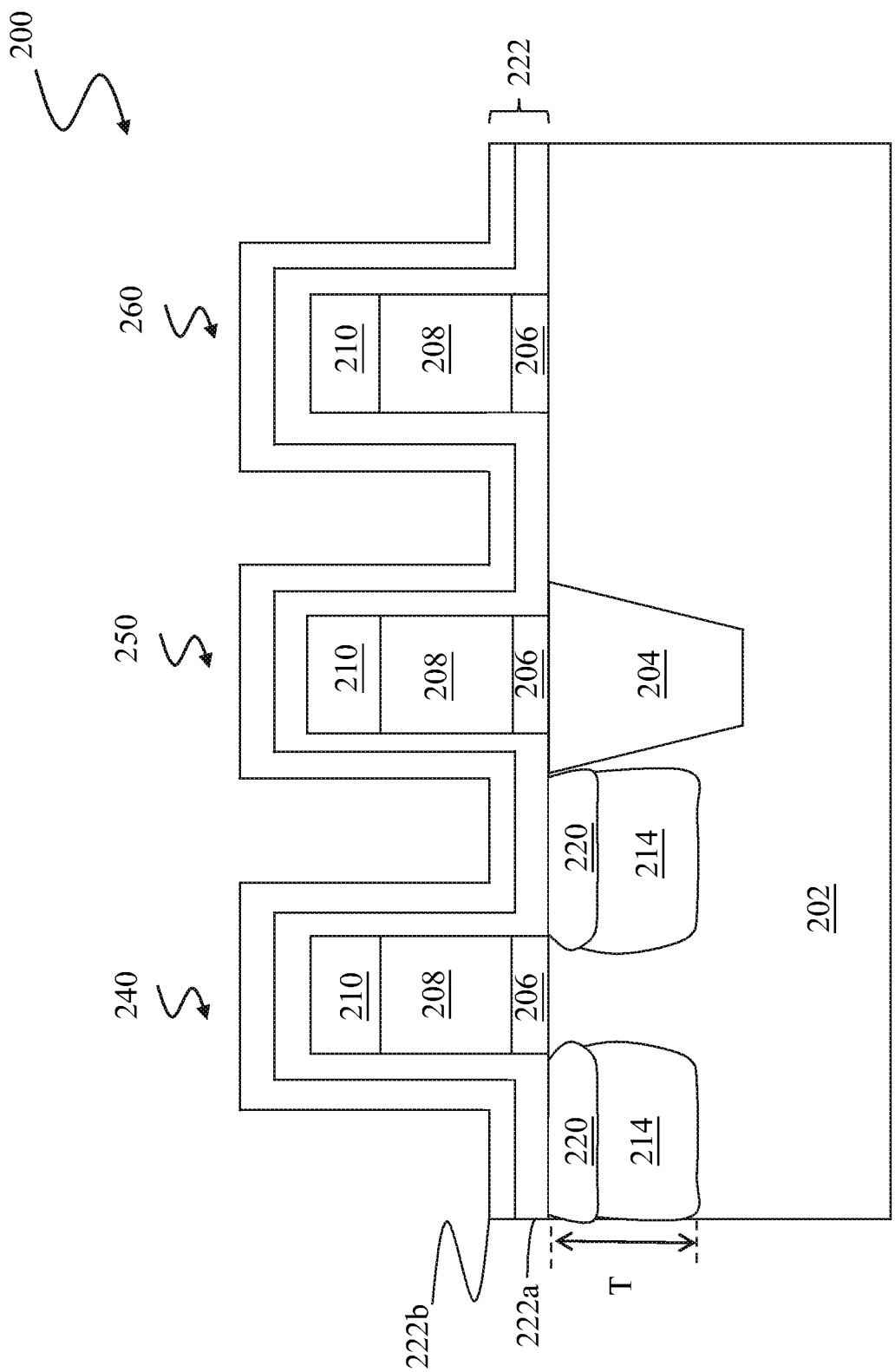

Referring to FIGS. 1 and 5, the method 100 proceeds to step 108 wherein a dummy spacer layer 222 is formed overlying the NMOS gate stack 240. In some embodiments, the dummy spacer layer 222 is formed overlying the NMOS gate stack 240, the PMOS gate stack 260, the dummy gate stack 250, and the substrate 202. In the present embodiment, the dummy spacer layer 222 includes a liner layer 222a and a spacer layer 222b overlying the liner layer 222a. The liner layer 222a, for example, is silicon oxide, oxynitride, silicon nitride, silicon boron nitride, or boron nitride. The thickness of the liner layer 222a ranges from about 15 Angstroms to about 100 Angstroms. The spacer layer 222b is a dielectric layer with a material different from the liner layer 222a. The spacer layer 222b, for example, is silicon oxide, oxynitride, silicon nitride, silicon boron nitride, or boron nitride. The spacer layer 222b, in one embodiment, has a thickness ranging from about 100 Angstroms to about 400 Angstroms, and preferably ranged from about 150 Angstroms to about 300 Angstroms. In one embodiment, the liner layer 222a is silicon oxide and the spacer layer 222b is silicon nitride. The liner layer 222a and the spacer layer 222b may be formed by using commonly used techniques, such as PECVD, LPCVD, sub-atmospheric chemical vapor deposition (SACVD), atomic layer deposition (ALD), and the like.

Figure 6:
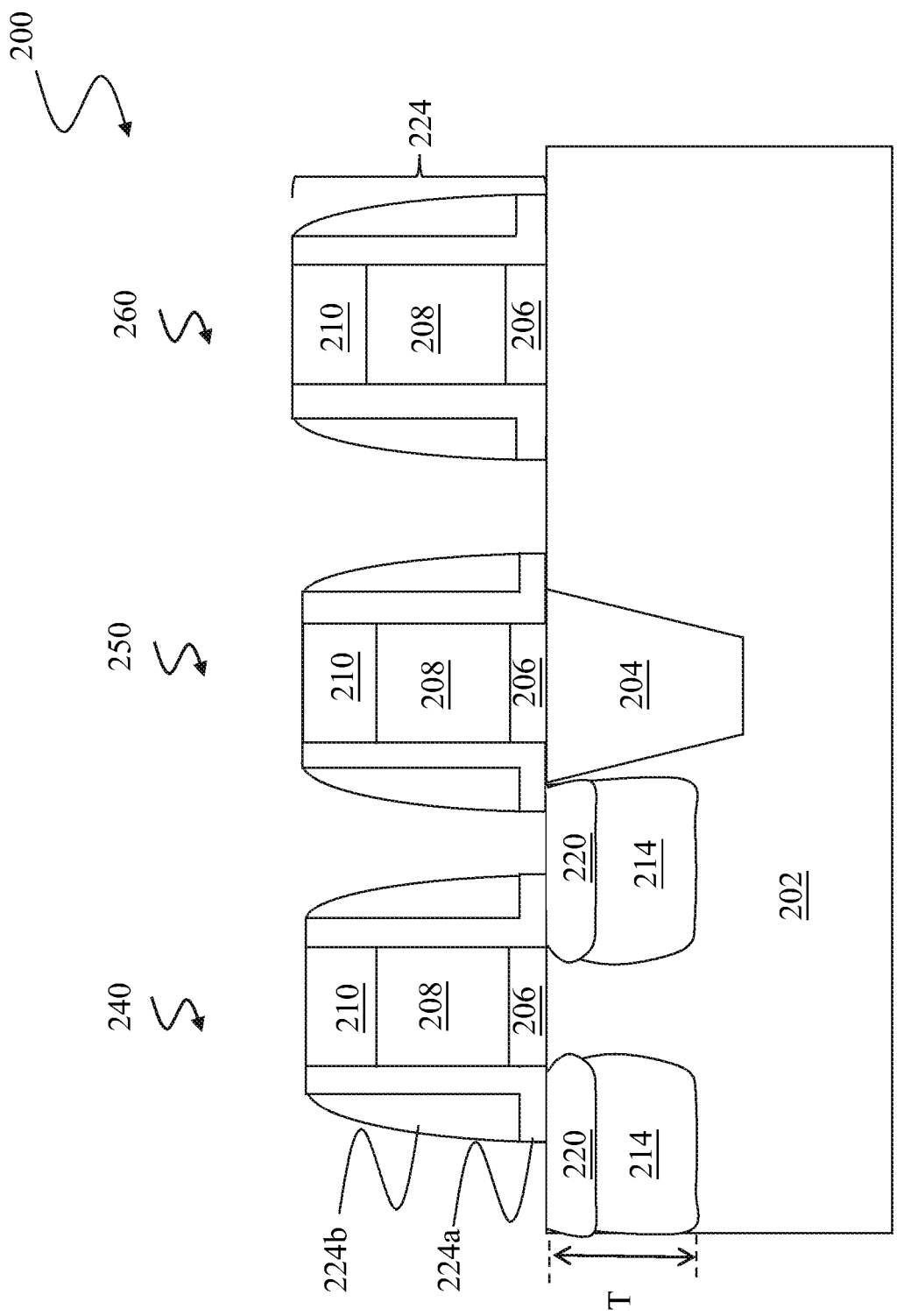

Referring to FIGS. 1 and 6, the method 100 proceeds to step 110 wherein dummy spacers 224 are formed adjoining opposite sidewalls of the NMOS gate stack 240. In some embodiments, the dummy spacers 224 are formed adjoining each of the opposite sidewalls of the NMOS gate stack 240, the dummy gate stack 250, and the PMOS gate stack 260. The dummy spacers 224 can protect the sidewalls of the NMOS gate stack 240, the dummy gate stack 250, and the PMOS gate stack 260. Alternatively, the dummy spacers 224 can be used to offset subsequently formed doped regions, such as heavily doped source/drain regions. The dummy spacers 224 include L-shape spacers 224a and D-shape spacers 224b adjoining the exterior surfaces of L-shape spacers 224a. In some embodiments, the dummy spacers 224 are formed by patterning the dummy spacer layer 222 using a wet etching process, a dry etching process, or combinations thereof. In the present embodiment, the dummy spacer layer 222 is patterned by a dry etching process, such as an anisotropic dry etching process.

Figure 7:
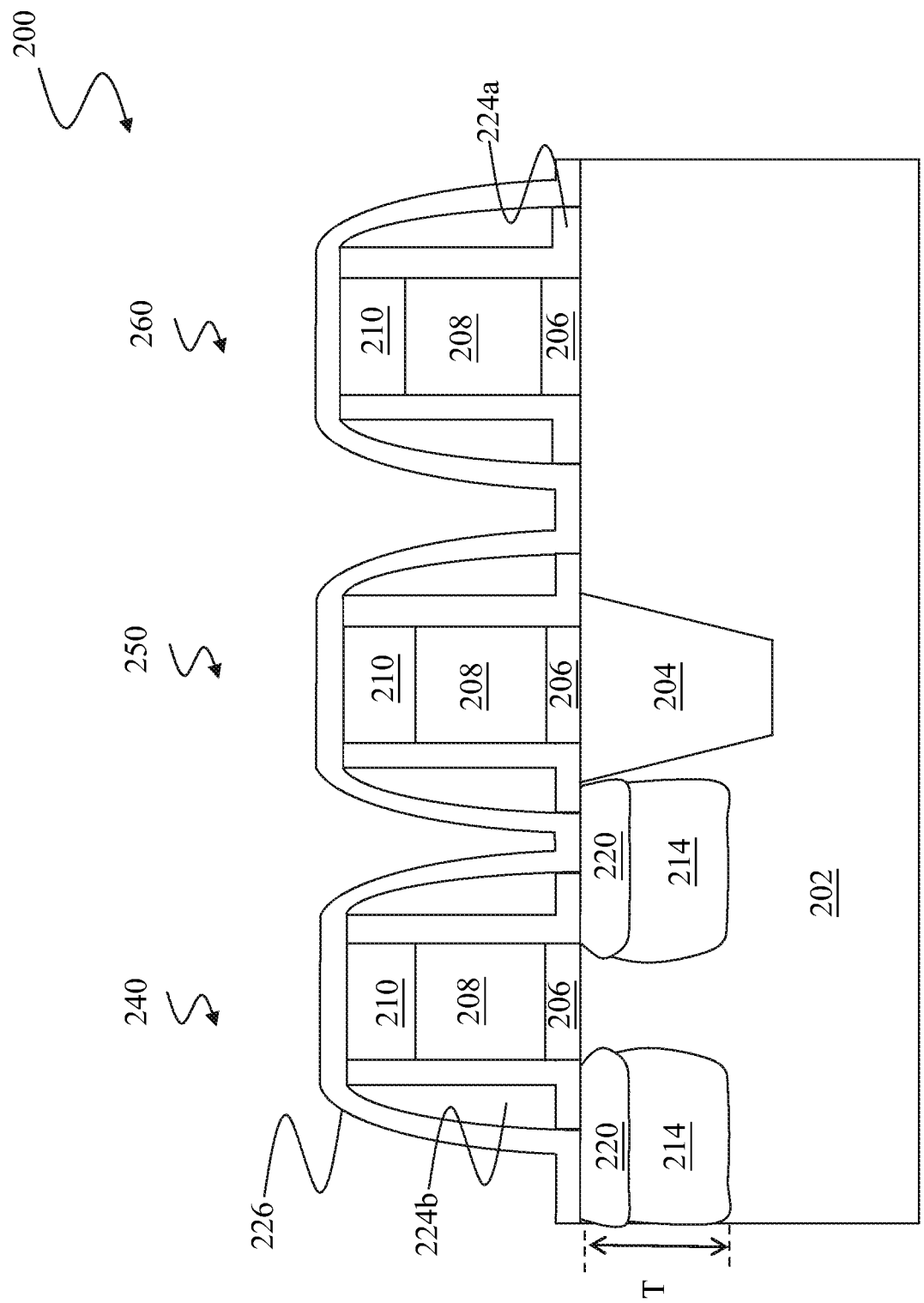

Referring to FIGS. 1 and 7, the method 100 proceeds to step 112 wherein a stress film 226 is deposited over the NMOS gate stack 240. In some embodiments, the stress film 226 is deposited over the NMOS gate stack 240, the dummy gate stack 250, the PMOS gate stack 260, and the substrate 202. The stress film 226 may be formed by CVD, PVD, ALD, high density plasma CVD (HDPCVD), plating, other suitable methods, and/or combinations thereof. The stress film 226 includes a dielectric material. In some embodiments, the stress film 226 includes silicon nitride, silicon oxynitride, SiCN, and/or combinations thereof. In alternative embodiments, the stress film 226 includes silicon oxide. In some embodiments, the stress film 226 has a thickness greater than the thickness of the dummy spacer layer 222. In some embodiments, the stress film 226 has a thickness ranging from about 100 angstroms to about 300 angstroms. In some embodiments, the stress film 226 is used to provide tensile stress in a subsequent annealing process which recrystallizes the amorphized regions 214.

Figure 8:
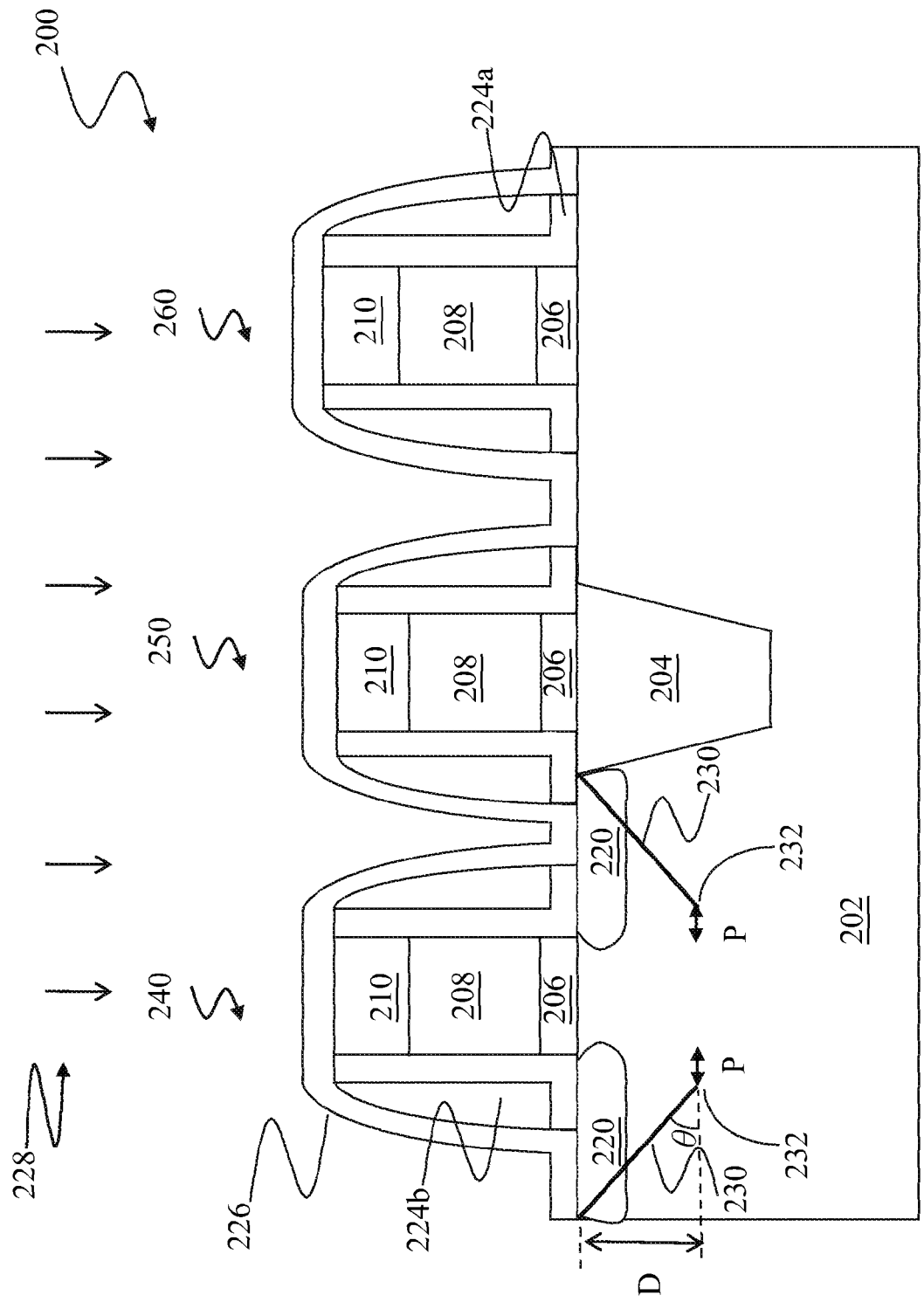

Referring to FIGS. 1 and 8, the method 100 proceeds to step 114 wherein an annealing process 228 is performed on the substrate 202. In some embodiments, the annealing process 228 is a rapid thermal annealing (RTA) process, spike RTA process, or a millisecond thermal annealing (MSA) process (e.g., millisecond laser thermal annealing process). In at least one embodiment, the annealing process 228 includes a RTA process performed at a temperature ranging from about 600° C. to about 750° C., lasting for a period of time ranging from about 10 seconds to about 5 minutes. In an alternative embodiment, the annealing process 228 includes a spike RTA process performed at a temperature ranging from about 990° C. to about 1050° C., lasting for a period of time ranging from about 0.1 seconds to about 2 seconds. In alternative embodiments, the annealing process 228 may further include a pre-heat step to minimize (or even eliminate) the end of range (EOR) defects. In some embodiments, the pre-heat step may be performed at a temperature ranging from about 400° C. to about 700° C. In some embodiments, the pre-heat step may be performed for a period of time ranging from about 10 seconds to about 5 minutes. In the present embodiment, the pre-heat step is performed at a temperature of about 550° C. lasting for about 30 seconds.

During the annealing process 228, as the amorphized regions 214 become re-crystallized, dislocations 230 of the re-crystallized counterpart of the amorphized regions 214 are formed in the substrate 202. In some embodiments, the dislocations 230 are formed adjacent to opposite edges of the NMOS gate stack 240. In some embodiments, the substrate 202 is referred to as a (100) substrate and the dislocations 230 are formed along a <111> direction. In some embodiments, the <111> direction has an angle θ, measured with respect to a reference level parallel to the surface of the substrate 202, ranging from about 25 degrees to about 45 degrees. In the present embodiment, the dislocations 230 have <111> direction with the angle θ of about 35 degrees. The dislocations 230 are formed starting at pinch-off points 232. The pinch-off points 232 have a depth D measured from the upper surface of the substrate 202. In some embodiments, the depth D of the pinch-off points 232 ranges from about 10 nanometers to about 150 nanometers. In the present embodiment, the depth D of the pinch-off points 232 ranges from about 10 nanometers to about 30 nanometers. The pinch-off points 232 have a horizontal buffer (proximity) P measured from an adjacent gate edge of the NMOS gate stack 240. The horizontal buffer P and the depth D are formed according to design specifications and are a function of the annealing process 228. In some embodiments, the horizontal buffer P of the pinch-off points 232 ranges from about −5 nanometers to about 10 nanometers ("−" represents the pinch-off points 232 are under the NMOS gate stack 240.). In the present embodiment, the horizontal buffer P of the pinch-off points 232 ranges from about 0 nanometers to about 5 nanometers. In the present embodiment, the horizontal buffer P of the pinch-off points 232 is less than about 3 nanometers. Preferably, the horizontal buffer P of the pinch-off points 232 is less than about 1 nanometer. The pinch-off points 232 may be formed such that they are not disposed within the channel region in the substrate 202 defined by the NMOS gate stack 240.

Figure 9:
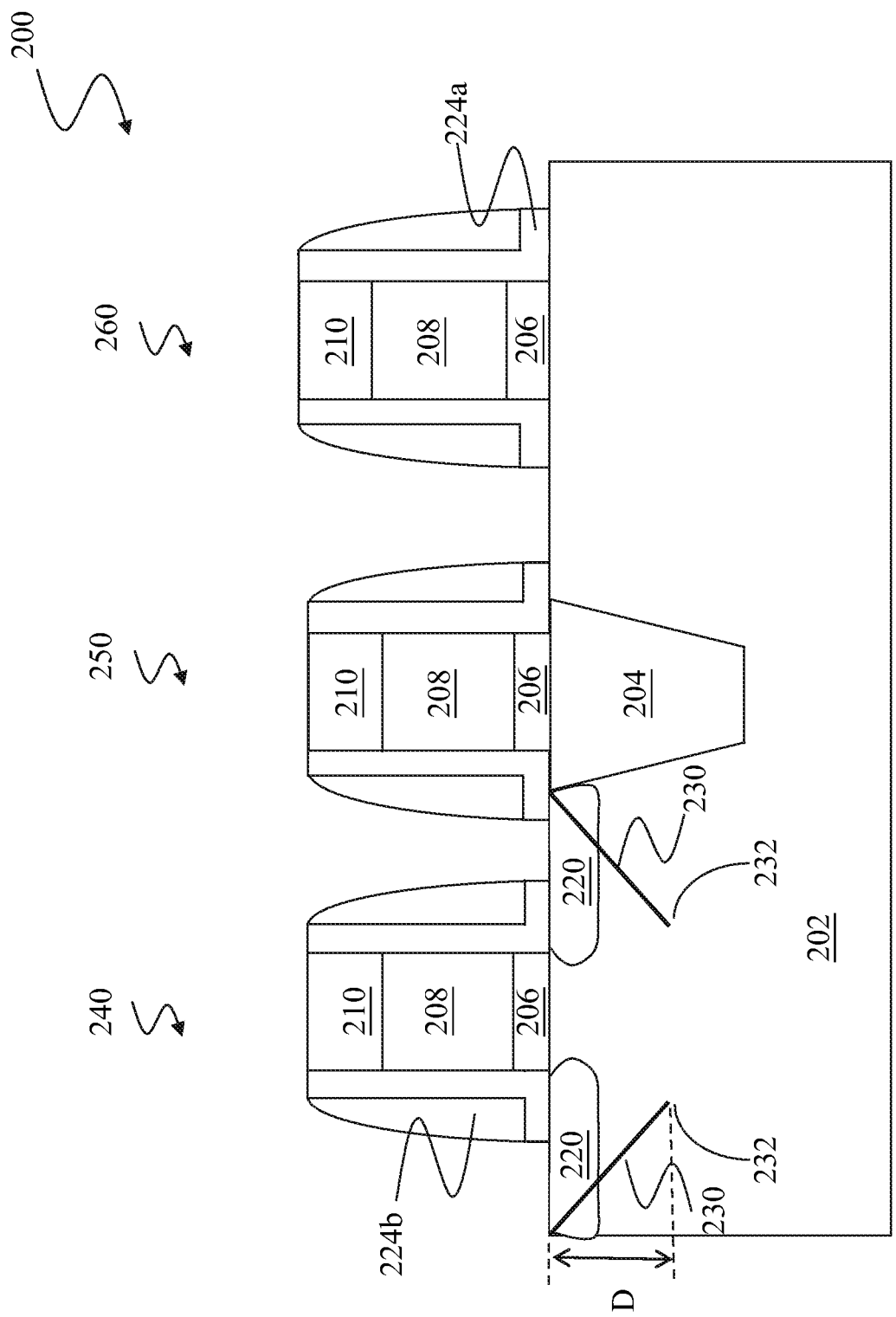

Referring to FIGS. 1 and 9, the method 100 proceeds to step 110 wherein the stress film 226 is removed from the substrate 202. The stress film 226 is removed, for example, by a wet etching using phosphoric acid or hydrofluoric acid, or by a dry etching using suitable etchant.

A benefit of the dislocations for the NMOS gate stacks, in accordance with the disclosed embodiments, is that the dislocations formed within the active region (e.g., source/drain) for the NMOS devices, may improve the stress within the channel region of the NMOS gate stack to increase device operation speed. The disclosed process for forming the dislocations before forming sidewall spacers adjoining NMOS gate stack may provide dislocations formed close to the channel region of the NMOS, therefore, enhancing the stress/strain effect. Moreover, the method for forming the dislocations is disclosed using the designed species with certain implantation energy to prevent negative proximity in NMOS. Thus, the disclosed embodiments provide increased stress level in the channel region to improve carrier mobility of one NMOS device required high operation speed without current crowding issue source resulted by the negative proximity. It is understood that different embodiments may have different advantages, and that no particular advantage is necessarily required of any embodiment.

The semiconductor device may undergo further CMOS or MOS technology processing to form various features. For example, the method 100 may proceed to form main spacers. Contact features, such as silicide regions, may also be formed. The contact features include silicide materials, such as nickel silicide (NiSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), other suitable conductive materials, and/or combinations thereof. The contact features can be formed by a process that includes depositing a metal layer, annealing the metal layer such that the metal layer is able to react with silicon to form silicide, and then removing the non-reacted metal layer. An inter-level dielectric (ILD) layer can further be formed on the substrate and a chemical mechanical polishing (CMP) process is further applied to the substrate to planarize the substrate. Further, a contact etch stop layer (CESL) may be formed on top of the gate structure before forming the ILD layer.

In an embodiment, the NMOS gate stack, the dummy gate stack, and the PMOS gate stack remain polysilicon in the final device. In another embodiment, a gate replacement process (or gate last process) is performed, where each of the polysilicon NMOS gate stack and the polysilicon PMOS gate stack are replaced with a metal gate. For example, a metal gate may replace the gate stack (i.e., polysilicon gate stack) of the NMOS gate stack 240 and the PMOS gate stack 260. The metal gate includes liner layers, work function layers, conductive layers, metal gate layers, fill layers, other suitable layers, and/or combinations thereof. The various layers include any suitable material, such as aluminum, copper, tungsten, titanium, tantalum, tantalum aluminum, tantalum aluminum nitride, titanium nitride, tantalum nitride, nickel silicide, cobalt silicide, silver, TaC, TaSiN, TaCN, TiAl, TiAlN, WN, metal alloys, other suitable materials, and/or combinations thereof.

Subsequent processing may further form various contacts/vias/lines and multilayer interconnect features (e.g., metal layers and interlayer dielectrics) on the substrate, configured to connect the various features or structures of the semiconductor device. The additional features may provide electrical interconnection to the device. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

The disclosed semiconductor device may be used in various applications such as digital circuit, imaging sensor devices, a hetero-semiconductor device, dynamic random access memory (DRAM) cell, a single electron transistor (SET), and/or other microelectronic devices (collectively referred to herein as microelectronic devices). Of course, aspects of the present disclosure are also applicable and/or readily adaptable to other type of transistor, including single-gate transistors, double-gate transistors, and other multiple-gate transistors, and may be employed in many different applications, including sensor cells, memory cells, logic cells, and others.

In one embodiment, a method includes forming a NMOS gate structure over a substrate, forming an amorphized region in the substrate adjacent to the NMOS gate structure, forming a lightly doped source/drain (LDD) region in the amorphized region, depositing a stress film over the NMOS gate structure, performing an annealing process, and removing the stress film.

In another embodiment, a method of manufacturing a semiconductor device, includes forming a NMOS gate structure and a PMOS gate structure over a substrate, forming a protector over the PMOS gate structure, performing an implantation process to form amorphized regions in the substrate adjacent to opposite edges of the NMOS gate structure, forming lightly doped source/drain (LDD) regions in the amorphized regions, forming spacers adjoining sidewalls of the NMOS gate structure and the PMOS gate structure, depositing a stress film over the spacers, the NMOS gate structure, and the PMOS gate structure, performing an annealing process to recrystallize the amorphized regions, and removing the stress film.

In still another embodiment, a semiconductor device includes a NMOS gate structure over a substrate and a dislocation in the substrate adjacent to an edge of the NMOS gate structure. The dislocation has a proximity less than about 3 nanometers.

The above disclosure provides many different embodiments, or examples, for implementing different features of the invention. Specific examples of components and arrangements are described above to simplify the present disclosure. These are, of course, merely examples and are not intended to be limiting. Accordingly, the components disclosed herein may be arranged, combined, or configured in ways different from the exemplary embodiments shown herein without departing from the scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a gate stack over a substrate,
   amorphizing a region of the substrate adjacent the gate stack to form an amorphized region;
   forming a sidewall spacer on a sidewall of the gate stack;
   implanting a source/drain region in the amorphized region of the substrate; and
   annealing the substrate to form a dislocation having a pinch-off point at a depth, relative a top surface of the substrate, from about 20 nm to about 150 nm, the pinch-off point having a horizontal offset, relative the sidewall of the gate stack, from about −5 nm to about 10 nm.

2. The method of claim 1, wherein implanting the source/drain region comprises using an implant energy less than about 20 KeV.

3. The method of claim 1, wherein implanting the source/drain region comprises using a silicon species.

4. The method of claim 1, wherein annealing the substrate comprises forming a dislocation with a proximity less than about 3 nanometers in the substrate adjacent to the gate stack.

5. The method of claim 1, wherein the amorphized region has a thickness less than about 150 nanometers.

6. The method of claim 1, further comprising:
   forming a dummy spacer layer over the gate stack and the substrate after forming the amorphized region; and
   patterning the dummy spacer layer to form spacers adjoining sidewalls of the gate stack.

7. The method of claim 6, wherein the dummy spacer layer comprises a spacer layer and a liner layer.

8. The method of claim 1, wherein the amorphized region is formed using an implantation process with an implantation dosage of about $1\times10^{14}$ atoms/cm$^2$ to about $2\times10^{15}$ atoms/cm$^2$.

9. A method, comprising:
   forming a gate structure over a substrate;
   amorphizing a region in the substrate adjacent to the gate structure to form an amorphized region using the gate structure as a mask;
   implanting a source/drain region into the amorphized region;
   after amorphizing the region of the substrate, forming a spacer on a sidewall of the gate structure;
   depositing a stress film over the gate structure;
   annealing the substrate to form a dislocation having a pinch-off point at a depth, relative a top surface of the substrate, from about 20 nm to about 150 nm, the pinch-off point having a horizontal offset, relative the sidewall of the gate structure, from about −5 nm to about 10 nm; and
   removing the stress film.

10. The method of claim 9, further comprising:
    forming a dummy spacer layer over the gate structure and the substrate after forming the amorphized region; and
    patterning the dummy spacer layer to form spacers adjoining sidewalls of the gate structure.

11. The method of claim 10, wherein the dummy spacer layer comprises a spacer layer and a liner layer.

12. The method of claim 9, wherein the amorphized region is formed using an implantation process using a species with an atomic mass less than about 28.

13. The method of claim 12, wherein the amorphized region is formed using an implantation process with a species of silicon.

14. The method of claim 9, wherein the amorphized region is formed using an implantation dosage of about $1 \times 10^{14}$ atoms/cm$^2$ to about $2 \times 10^{15}$ atoms/cm$^2$.

15. The method of claim 9, wherein the amorphized region is formed using an implantation process with an implant energy less than about 20 KeV.

16. The method of claim 9, wherein there is not a sidewall spacer adjoining a sidewall of the gate structure when forming the amorphized region.

17. The method of claim 9, wherein the stress film provides tensile stress during the annealing.

18. A semiconductor device, comprising:
a gate stack over a substrate;
a source/drain region in the substrate; and
a dislocation having a pinch-off point at a depth, relative a top surface of the substrate, of from about 20 nm to about 150 nm, the pinch-off point having a horizontal offset, relative the sidewall of the gate stack from about −5 nm to about 10 nm.

19. The semiconductor device of claim 18, wherein the source/drain region has a species of silicon therein, and wherein the source/drain region does not have germanium therein.

20. The semiconductor device of claim 18, wherein the dislocation has a proximity less than about 1 nm.

* * * * *